(12) United States Patent
Mitra et al.

(10) Patent No.: US 10,541,236 B2
(45) Date of Patent: Jan. 21, 2020

(54) ELECTROSTATIC DISCHARGE DEVICES WITH REDUCED CAPACITANCE

(71) Applicant: GLOBALFOUNDRIES INC., Grand Cayman (KY)

(72) Inventors: Souvick Mitra, Essex Junction, VT (US); Mickey Yu, Essex Junction, VT (US); Alain F. Loiseau, Williston, VT (US); You Li, South Burlington, VT (US); Robert J. Gauthier, Jr., Williston, VT (US); Tsung-Che Tsai, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/018,549

(22) Filed: Jun. 26, 2018

(65) Prior Publication Data

US 2019/0393209 A1 Dec. 26, 2019

(51) Int. Cl.
| | |
|---|---|
| *H01L 27/02* | (2006.01) |
| *H01L 23/60* | (2006.01) |
| *H01L 21/8238* | (2006.01) |
| *H01L 27/092* | (2006.01) |
| *H01L 29/78* | (2006.01) |
| *H01L 29/66* | (2006.01) |

(52) U.S. Cl.
CPC .. *H01L 27/0248* (2013.01); *H01L 21/823821* (2013.01); *H01L 23/60* (2013.01); *H01L 27/0924* (2013.01); *H01L 29/66795* (2013.01); *H01L 29/785* (2013.01)

(58) Field of Classification Search
CPC ....... H01L 21/76224; H01L 21/823431; H01L 21/8249; H01L 27/0251; H01L 27/0255; H01L 27/0262; H01L 27/0266; H01L 27/0629; H01L 27/0924; H01L 29/6609; H01L 29/66371; H01L 29/66795; H01L 29/785; H01L 27/0248; H01L 23/60
See application file for complete search history.

(56) References Cited

U.S. PATENT DOCUMENTS

| | | | |
|---|---|---|---|
| 2016/0020203 A1* | 1/2016 | Zhang | H01L 27/0255 257/355 |
| 2016/0204259 A1* | 7/2016 | Fan | H01L 29/66136 438/231 |
| 2017/0263601 A1* | 9/2017 | Bu | H01L 27/0266 |
| 2018/0315831 A1* | 11/2018 | Li | H01L 29/66545 |

\* cited by examiner

*Primary Examiner* — Mohammed Shamsuzzaman

(74) *Attorney, Agent, or Firm* — David Cain; Andrew M. Calderon; Roberts Mlotkowski Safran Cole & Calderon, P.C.

(57) ABSTRACT

The present disclosure relates to semiconductor structures and, more particularly, to electrostatic discharge structures with reduced capacitance and methods of manufacture. The structure includes: a plurality of fin structures provided in at least one N+ type region and at least one P+ region; and a plurality of gate structures disposed over the plurality of fin structures and within the at least one N+ type region and one P+ region, the plurality of gate structures being separated in a lengthwise direction between the at least one N+ type region and the least one P+ region.

14 Claims, 3 Drawing Sheets

ELECTROSTATIC DISCHARGE DEVICES WITH REDUCED CAPACITANCE

FIELD OF THE INVENTION

The present disclosure relates to semiconductor structures and, more particularly, to electrostatic discharge structures with reduced capacitance and methods of manufacture.

BACKGROUND

Electrostatic discharge (ESD) is the sudden flow of electricity between two electrically charged objects caused, e.g., by an electrical short or dielectric breakdown. ESD can cause damage to sensitive electronic devices and, in some instances, ESD events can even cause failure of integrated circuits, particularly as they become more miniaturized or scaled down. For this reason, ESD is one of the primary considerations in semiconductor advanced technology nodes.

For example, the trend in scaling the technology nodes (miniaturizing) of integrated circuits (ICs) has resulted in smaller devices which consume less power, yet provide more functionally at higher speeds. The miniaturization process, though, has also increased device susceptibility to ESD events due to various factors including the use of thinner dielectric materials and associated lowered dielectric breakdown voltages. ESD structures or devices are designed to protect the circuit from such ESD events. However, conventional ESD structures have an inherently large capacitance which can affect the devices which they are protecting.

SUMMARY

In an aspect of the disclosure, a structure includes: a plurality of fin structures provided in at least one N+ type region and at least one P+ region; and a plurality of gate structures disposed over the fin structures and within the at least one N+ type region and one P+ region, the plurality of gate structures being separated in a lengthwise direction between the at least one N+ type region and the least one P+ region.

In an aspect of the disclosure, a structure comprises: a first region of a first dopant type, extending over a plurality of fin structures; a second region of a second dopant, extending over the plurality of fin structures and adjacent to the first region; a third region of the first dopant type, extending over the plurality of fin structures and adjacent to the second region; a first plurality of gate structures in the first region; a second plurality of gate structures in the second region; and a third plurality of gate structures in the third region, wherein the first plurality of gate structures, the second plurality of gate structures and the third plurality of gate structures are separated in a lengthwise direction.

In an aspect of the disclosure, a method comprises: forming a plurality of fin structures in at least one N+ type region and at least one P+ region; and forming a plurality of separated gate structures over the plurality of fin structures and within the at least one N+ type region and one P+ region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electrostatic discharge (ESD) structures with reduced capacitance and methods of manufacture. More specifically, the present disclosure describes ESD structures with staggered gate structures or cut gate structures (with respect to a longitudinal direction) extending over a plurality of fin structures. In embodiments, the ESD device can be implemented in electronic devices including, e.g., high speed switches (HSS) for Rf applications amongst others.

Advantageously, the cut or staggered gate structures will effectively reduce the capacitance of the structures by disrupting an electrical path between the gate structures and epitaxial regions. For example, the ESD structures described herein provide a significant reduction in capacitance (e.g., 40% or more) or optimization of capacitance compared to conventional ESD structures.

The ESD structures of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD structures of the present disclosure have been adopted from integrated circuit (IC) technology. For example, the structures are built on wafers and are realized in films of material patterned by photolithographic processes on the top of a wafer. In particular, the fabrication of the ESD structures uses three basic building blocks: (i) deposition of thin films of material on a substrate, (ii) applying a patterned mask on top of the films by photolithographic imaging, and (iii) etching the films selectively to the mask.

Figure 1:
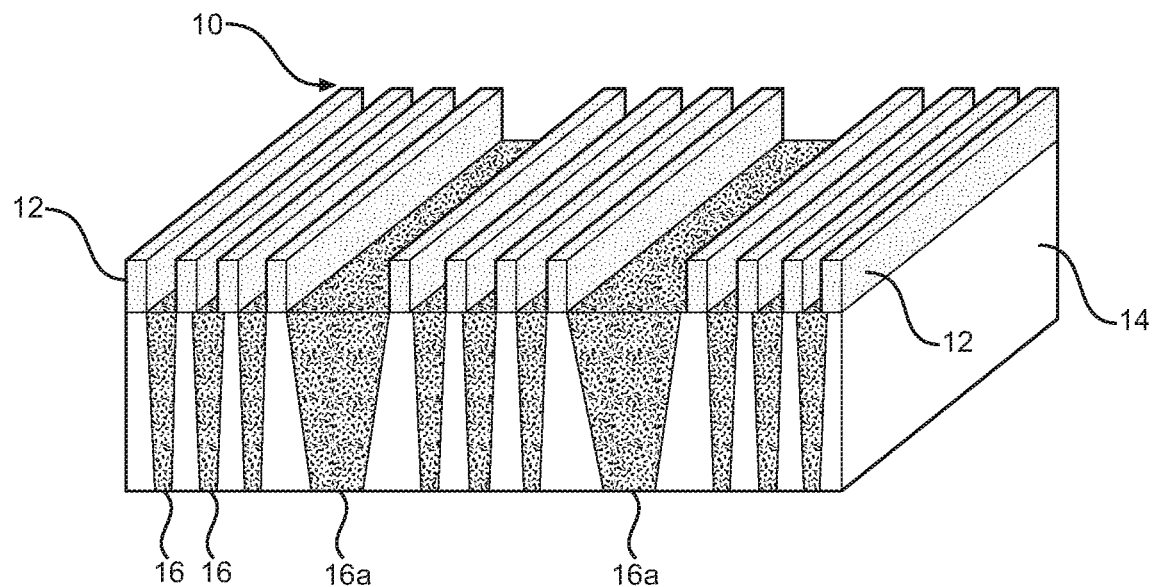
FIG. 1 shows fin structures, amongst other features, and respective fabrication processes in accordance with aspects of the present disclosure.

FIG. 1 shows fin structures, amongst other features, and respective fabrication processes in accordance with aspects of the present disclosure. In embodiments, the structure 10 includes a plurality of fin structures 12 composed of a substrate material 14. In embodiments, the substrate material 14 can be any semiconductor material. For example, the substrate material 14 may be composed of, but not limited to, Si, SiGe, SiGeC, SiC, GaAs, InAs, InP, and other III/V or II/VI compound semiconductors.

The fin structures 12 can be fabricated using conventional lithography and etching processes. For example, the fin structures 12 can be fabricated using sidewall image transfer (SIT) techniques. In an example of a SIT technique, a mandrel material, e.g., $SiO_2$, is deposited on the substrate material 14 using conventional CVD processes. A resist is formed on the mandrel material, and exposed to light to form a pattern (openings). A reactive ion etching (RIE) is performed through the openings to form the mandrels which can have different widths and/or spacing depending on the desired dimensions between the fin structures 12. Spacers are formed on the sidewalls of the mandrels which are preferably material that is different than the mandrels, and which are formed using conventional deposition processes known to those of skill in the art. The spacers can have a width which matches the dimensions of the fin structures 12, for example. The mandrels are removed or stripped using a conventional etching process, selective to the mandrel material. An etching is then performed within the spacing of the spacers to form the sub-lithographic features, i.e., fin structures 12. The sidewall spacers can then be stripped.

As further shown in FIG. 1, shallow trench isolation (STI) features 16, 16a are formed in the substrate 14 between the fin structures 12. In embodiments, the STI features 16, 16a can be oxide filled trenches formed in the substrate material 14. The STI features 16, 16a can be fabricated using conventional lithography, etching and deposition techniques. For example, a resist formed over the substrate material 14 is exposed to energy (light) to form a pattern (opening). An etching process with a selective chemistry, e.g., RIE, will be used to form one or more trenches in the substrate material 14 through the openings of the resist. The resist can then be removed by a conventional oxygen ashing process or other known stripants. Following the resist removal, the insulator material, e.g., oxide material, can be deposited by any conventional deposition processes, e.g., chemical vapor deposition (CVD) processes. Any residual material on the surface of the substrate material 14 can be removed by conventional chemical mechanical polishing (CMP) processes. In embodiments, the STI features 16, 16a can be formed prior to the fin structures 12.

Figure 2:
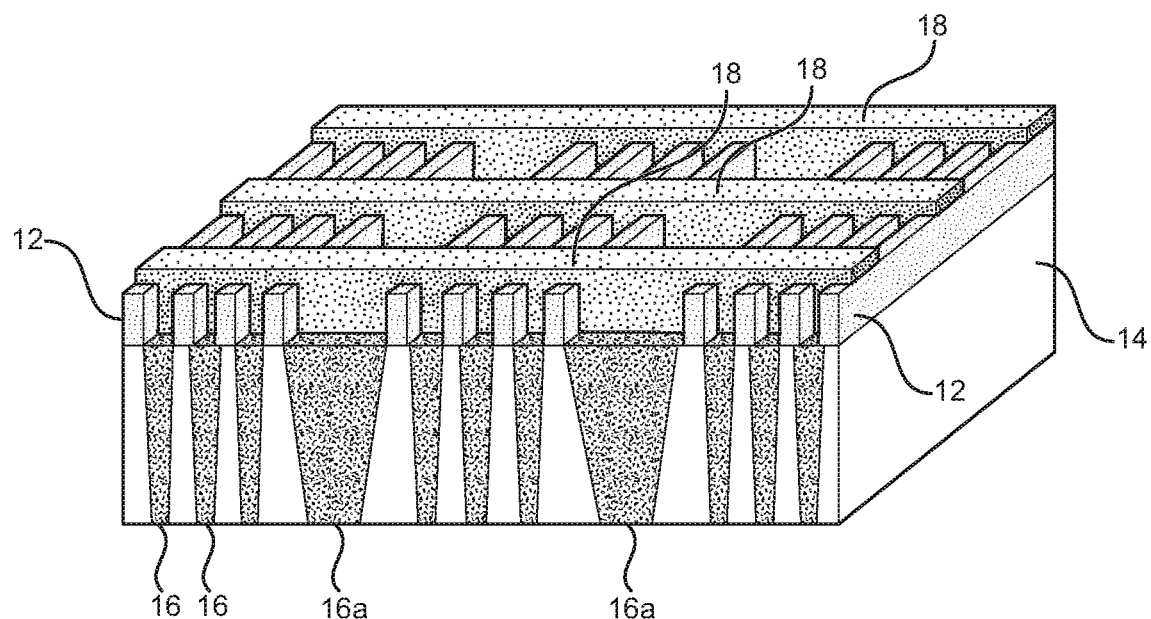
FIG. 2 shows the structure of FIG. 1 with gate structures, amongst other features, and respective fabrication processes in accordance with aspects of the present disclosure.

In FIG. 2, a plurality of gate structures 18 are formed over the fin structures 12. The gate structures 18 can be fabricated using any known gate fabrication processes including gate first processes or gate last processes. For example, in the gate first process, gate dielectric material, e.g., high-k gate dielectric material such as hafnium based dielectrics, can be deposited over the fin structures 12, followed by the deposition of metal gate material, e.g., workfunction metals or polysilicon, and a capping material (e.g., SiN). Following the patterning of the gate dielectric material, metal gate material and capping material, gate sidewall material can be deposited and patterned onto the sidewalls to form the gate structure 18. In a gate last or replacement gate process, for example, dummy gate material formed within trenches of dielectric material can be removed and then replaced with the gate materials noted herein.

Figure 3:
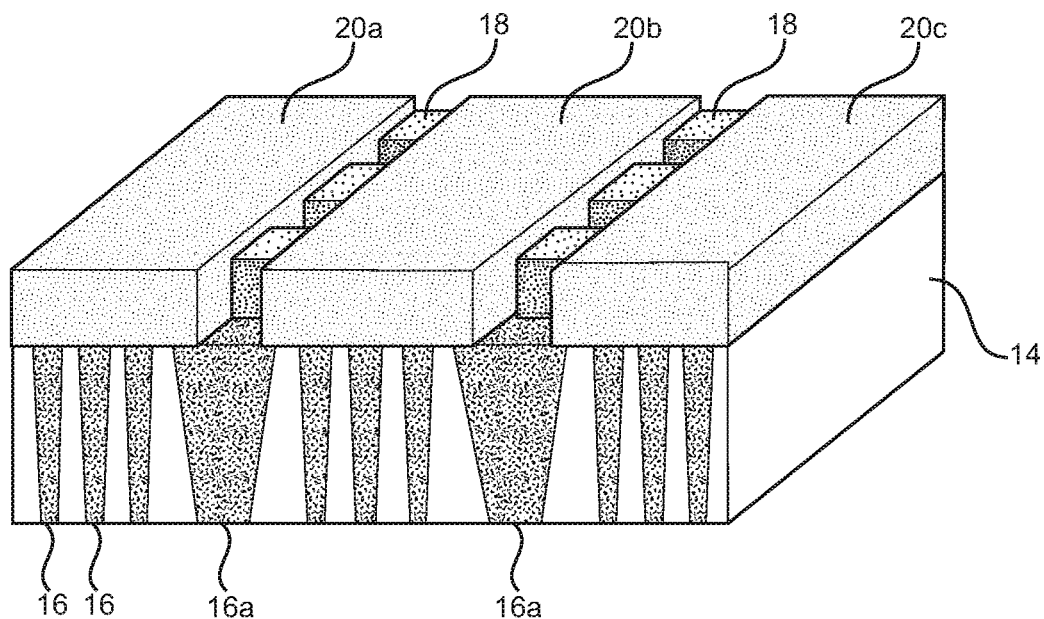
FIG. 3, shows the structure of FIG. 2 with N+ type and P+ type epitaxial material deposited over the gate structures, amongst other features, and respective fabrication processes in accordance with aspects of the present disclosure.

In FIG. 3, N+ type and P+ type epitaxial material 20a, 20b and 20c are deposited over the multiple gate structures 18 in the respective regions of the structure. For example, the epitaxial material 20a and 20c can be N+ type material provided over multiple gate structures 18; whereas, the epitaxial material 20b can be a P+ type material provided over multiple gate structures 18. In alternative embodiments, the epitaxial material 20a and 20c can be P+ type material; whereas, the epitaxial material 20b can be a N+ type material.

In any of the embodiments, the epitaxial material 20a, 20b and 20c can be deposited by conventional additive or subtractive processes. For example, to form the epitaxial material 20a, 20b, 20c over the gate structures 18, trenches are fabricated within a dielectric material (over the gate structures 18 and between the STI features 16a) using conventional lithography and etching processes, followed by the deposition of the epitaxial material 20a, 20c using conventional deposition processes, e.g., CVD. While protecting the epitaxial material 20a, 20c, another trench is formed within the dielectric material followed by the deposition of the epitaxial material 20b. Of course, it should be understood by those of skill in the art that the epitaxial material 20b can be provided first followed by the epitaxial materials 20a, 20c. In embodiments, the epitaxial material 20a, 20b, 20c is doped material, deposited with an appropriate dopant within a deposition chamber as should be understood by those of skill in the art such that no further explanation is required for an understanding of the present disclosure. If necessary, the epitaxial material 20a, 20b, 20c can be planarized using conventional planarization techniques, e.g., chemical mechanical polishing (CMP).

Figure 4:
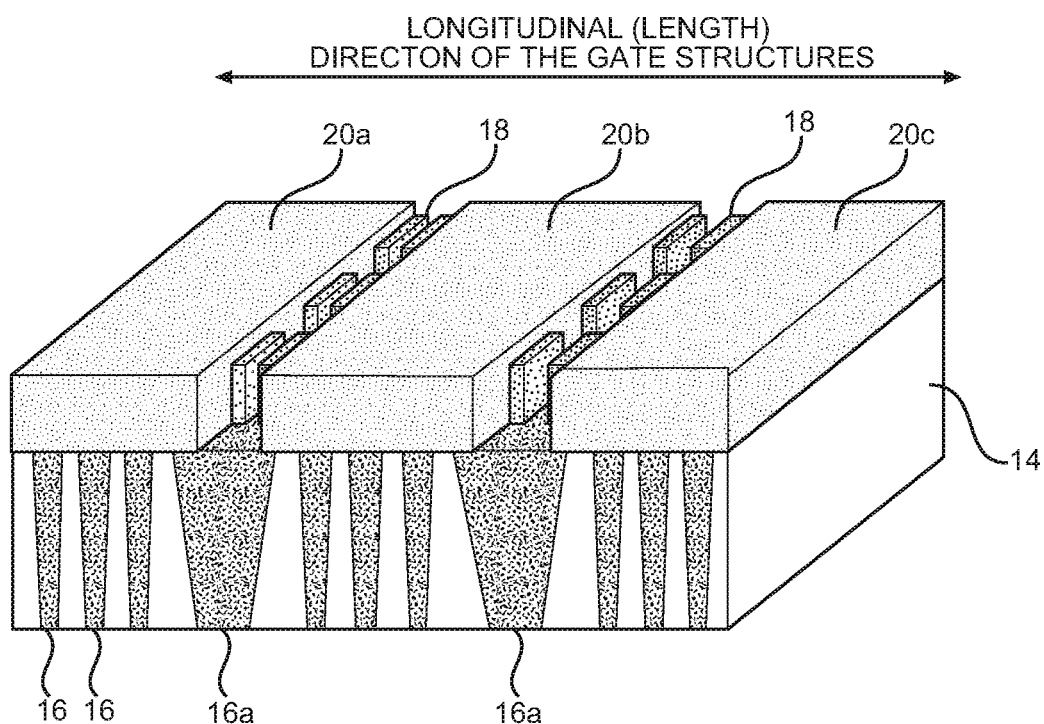
FIG. 4 shows the structure of FIG. 3 with cut gate structures to reduce capacitance and respective fabrication processes in accordance with aspects of the present disclosure.

As shown in FIG. 4, the gate structures 18 are provided with a transverse cut 22 so that they can be separated along their longitudinal direction (e.g., lengthwise direction) (see arrow in FIG. 4). The cuts 22 are located between the epitaxial material 20a, 20b and 20c. Also, the cut 22 is preferably provided over the STI features 16a, with the ends of the gate structures 18 being in alignment in each respective region comprising the epitaxial material 20a, 20b, 20c. Although a single transverse cut 22 for each gate structure 18 is shown between the epitaxial material 20a, 20b, 20c, it should be understood by those of skill in the art that multiple gate cuts can also be provided. In embodiments, the cuts 22 will separate the gate structures 18 that are extending underneath the epitaxial material 20a, 20b 20c, effectively reducing the overall capacitance of the structure 10. Specifically, the overall capacitance of the structure 10 is reduced by disrupting an electrical pathway between the respective gate structures 18 under the respective epitaxial material 20a, 20b and 20c, i.e., disrupting the P+ to N+ path between the gate structures 18.

Figure 5:
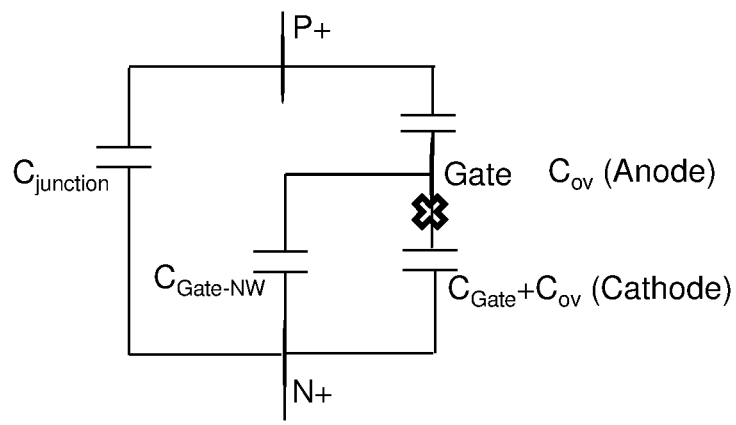
FIG. 5 shows a schematic diagram of the ESD device of FIG. 1 (and FIG. 3) in accordance with aspects of the present disclosure.

FIG. 5 shows a schematic circuit of the structure 10 of FIG. 4. In the schematic of FIG. 5, $C_{ov}$ represents the capacitance between the gate structures 18 and the fin structures 12, and $G_{gate}$ represents the capacitance of the gate structures 18. $C_{gate-NW}$ represents the capacitance between the gate structures 18 and the N+ epitaxial material 20a, 20c and $C_{junction}$ is the capacitance between the gate structure and the gate junction (substrate). As representatively shown in FIG. 5, the pathway between the gate structure and $C_{gate}+C_{ov}$ (cathode) is disrupted due to the cut, effectively reducing the capacitance of the structure.

Figure 6:
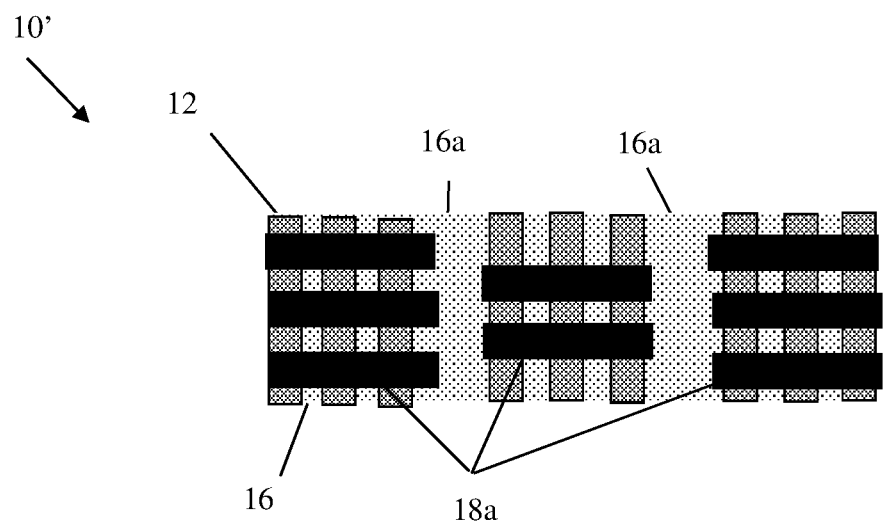
FIG. 6 shows another ESD device with staggered gate structures to reduce capacitance and respective fabrication processes in accordance with additional aspects of the present disclosure.

FIG. 6 shows another ESD device with a related circuit and respective fabrication processes in accordance with aspects of the present disclosure. In particular, the structure shown in FIG. 6 has staggered or offset gates 18a with respect to each of the respective regions, i.e., under the epitaxial material 20a, 20b and 20c (not shown). Accordingly, instead of providing a gate cut for disrupting the electrical pathway, the capacitance of the structure 10' is reduced by staggering the gate structures 18a along their longitudinal direction (axis) to maintain a separation of the gate structures 18a. The staggered gate structures 18a can be fabricated using conventional lithography, etching and deposition processes as described herein such that no further explanation is required for an understanding of the present disclosure. Although the epitaxial material 20a, 20b, 20c is not shown (in order to show the staggered gate structures), it should be understood that the remaining features of the structure 10' are similar to that shown in the structure 10 of FIG. 4.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An electrostatic discharge structure, comprising:
a plurality of fin structures provided in at least one N+ type region and at least one P+ region; and
a plurality of gate structures disposed over the plurality of fin structures and within the at least one N+ type region and one P+ region, the plurality of gate structures being separated in a lengthwise direction between the at least one N+ type region and the least one P+ region,
wherein the at least one N+ type region and at least one P+ region comprise N+ type epitaxial material and P+ type epitaxial material deposited over the plurality of gate structures in the at least one N+ type region and in the at least one P+ region respectively;
wherein the plurality of gate structures disposed over the plurality of fin structures comprise a transverse cut which separates them along the lengthwise direction, the transverse cut being located between the N+ type epitaxial material and P+ type epitaxial material and over the shallow trench isolation features, with the ends of the plurality of gate structures being in alignment in each respective region.

2. The structure of claim 1, wherein the plurality of gate structures are cut transversely to maintain a separation between the gate structures in the lengthwise direction and between at least one N+ type region and the least one P+ type region.

3. The structure of claim 2, wherein the plurality of gate structures include multiple gate structures over each of the at least one N+ type region and the at least one P+ type region, wherein ends of the multiple gate structures are aligned and separated from each along the lengthwise direction.

4. The structure of claim 1, wherein the fin structures are composed of semiconductor material.

5. The structure of claim 1, wherein the at least one N+ region is two N+ regions adjacent to the at least one P+ region.

6. The structure of claim 5, wherein the two N+ regions and the at least one P+ region are epitaxial material with N+ doping and P+ doping, respectively.

7. The structure of claim 5, wherein the separation of the plurality of gate structures in the lengthwise direction between the at least one N+ type region and the least one P+ region disrupts a capacitance pathway.

8. The structure of claim 1, wherein the at least one P+ region is two P+ regions adjacent to the at least one N+ region.

9. An electrostatic discharge structure, comprising:
a first region of a first dopant type extending over a plurality of fin structures; a second region of a second dopant extending over the plurality of fin structures and adjacent to the first region;
a third region of the first dopant type extending over the plurality of fin structures and adjacent to the second region;
a first plurality of gate structures in the first region; a second plurality of gate structures in the second region; and
a third plurality of gate structures in the third region,
wherein the first plurality of gate structures, the second plurality of gate structures and the third plurality of gate structures are separated in a lengthwise direction, and
wherein the first dopant type is a first doped epitaxial material deposited over the plurality of fin structures and the first plurality of gate structures in the first region and the third plurality of gate structures in the third region, and
wherein the second dopant type is a second doped epitaxial material deposited over the plurality of fin structures and the second plurality of gate structures in the second region;
wherein the first, second and third plurality of gate structures are each cut along the lengthwise direction so as to separate from one another each of the first, second and third plurality of gate structures, the cuts are located (i) between the first doped epitaxial material deposited over the first plurality of gate structures in the first region and the second doped epitaxial material deposited over the second plurality of gate structures in the second region and (ii) between the first doped epitaxial material deposited over the third plurality of gate structures in the third region and the second doped epitaxial material deposited over the second plurality of gate structures in the second region, and the cuts are further provided over shallow trench isolation regions which are devoid of the first doped epitaxial material and the second doped epitaxial material.

10. The structure of claim 9, wherein the first region and the third region are N+ type regions and the second region is a P+ type region.

11. The structure of claim 9, wherein the first region and the third region are P+ type regions and the second region is a N+ type region.

12. The structure of claim 9, wherein individual gate structures of the first plurality of gate structures, the second plurality of gate structures and the third plurality of gate structures are each aligned end to end.

13. The structure of claim 9, wherein the separation of the plurality of gate structures in the lengthwise direction disrupts a capacitance pathway.

14. The structure of claim 13, wherein the capacitance pathway is between the gate structures and two differently doped regions.

* * * * *